United States Patent
McManus

[11] Patent Number: 5,880,605
[45] Date of Patent: Mar. 9, 1999

[54] LOW-POWER 5 VOLT TOLERANT INPUT BUFFER

[75] Inventor: Michael J. McManus, Fort Collins, Colo.

[73] Assignee: LSI Logic Corporation, Milpitas, Calif.

[21] Appl. No.: 747,408

[22] Filed: Nov. 12, 1996

[51] Int. Cl.$^6$ ............................................. H03K 19/0185
[52] U.S. Cl. .................................. 326/86; 326/83; 326/81
[58] Field of Search ................................. 326/23, 80, 81, 326/83, 68, 86, 121

[56] References Cited

U.S. PATENT DOCUMENTS

| | | | |
|---|---|---|---|
| 4,820,941 | 4/1989 | Dolby et al. ............................... | 326/83 |
| 4,963,766 | 10/1990 | Lundberg ................................. | 307/451 |
| 5,304,872 | 4/1994 | Avraham et al. ......................... | 326/68 |
| 5,319,259 | 6/1994 | Merrill ..................................... | 307/443 |
| 5,347,150 | 9/1994 | Sakai et al. .............................. | 259/203 |
| 5,381,059 | 1/1995 | Douglas ................................... | 326/58 |
| 5,416,368 | 5/1995 | Sugibayashi ............................. | 326/81 |
| 5,448,198 | 9/1995 | Toyoshima et al. ..................... | 327/530 |
| 5,450,025 | 9/1995 | Shay ........................................ | 326/81 |
| 5,451,889 | 9/1995 | Heim et al. .............................. | 326/81 |
| 5,455,532 | 10/1995 | Bass ........................................ | 327/306 |
| 5,495,185 | 2/1996 | Goto ........................................ | 326/81 |
| 5,546,019 | 8/1996 | Liao ......................................... | 326/81 |
| B1 4,963,766 | 8/1992 | Lundberg ................................. | 307/451 |

FOREIGN PATENT DOCUMENTS

| | | | |
|---|---|---|---|
| 0439149 | 7/1991 | European Pat. Off. ... | H03K 19/0185 |
| 0720294 | 7/1996 | European Pat. Off. ..... | H03K 19/003 |
| 4-37217 (A) | 2/1992 | Japan ...................................... | 326/80 |

Primary Examiner—Jon Santamauro
Assistant Examiner—Don Phu Le
Attorney, Agent, or Firm—David K. Lucente

[57] ABSTRACT

The present invention is directed to a low-power input buffer comprising an inverter coupled to receive a first safe voltage range to a first node and coupled to provide an output signal, and a low-power circuit coupled to receive a second safe voltage range and coupled to control a voltage at the first node in response to the output signal and the second safe voltage range. The first and second safe voltage ranges preferably are equivalent. The low-power circuit includes series transistors coupled to the first node and responsive to the voltage at the output node. The low-power circuit further includes a transistor coupled between the first and second nodes and responsive to an input voltage. A method of operating an input buffer comprises the steps of pulling up a voltage of a first node in response to voltages of a second node and an output node and pulling down the voltage at the first node and the second node in response to an input voltage to provide low power consumption and a high impedance input.

12 Claims, 2 Drawing Sheets

LOW-POWER 5 VOLT TOLERANT INPUT BUFFER

FIELD OF THE INVENTION

The present invention relates to an input buffer and more particularly to a low-power buffer that can tolerate an input voltage greater than a supply voltage.

BACKGROUND OF THE INVENTION

Integrated circuits are becoming more dense as the dimensions of semiconductor devices decrease. The decreased dimensions also provide for faster devices that require less power to operate. In particular, present generation semiconductor devices, such as transistors, operate on less voltage (~3.3V) than the previous generation voltage (5V). One benefit of having lower operating voltage, and consequently lower power consumption, is that demands on the power supply is decreased. This is especially important where the portability of an electronic device incorporating these semiconductor devices is desired. The power supply, such as a battery, can be smaller or would last longer.

Many electronic devices and components, however, still incorporate integrated circuits consisting of semiconductor devices that use a higher voltage (5V). Thus, applications may arise where both low and high voltage integrated circuits are connected together. An integrated circuit operating on a lower voltage must then to receive an input at the higher voltage. However, the structural integrity of the thin film oxide will suffer if exposed to voltage potentials in excess of the maximum rated supply, typically 3.6V to 4.0V. A 5 volt drop from the gate to the drain, source or substrate will tend to breakdown this oxide. A long-term reliability issue will result, with the oxide breakdown eventually causing catastrophic damage to the transistor.

Referring to FIG. 1, an input buffer 100 is illustrated. A lead 105 couples an input pad (not shown) to an n-channel transistor 110. A gate of n-channel transistor 110 is coupled to a voltage supply (not shown) via a lead 115. A substrate of n-channel transistor 110 is coupled to a reference supply (not shown) via a lead 120.

A node 125 is coupled to gates of a p-channel transistor 130 and an n-channel transistor 135. A source and a substrate of p-channel transistor 130 is coupled via a lead 140 to the voltage supply. A source and a substrate of n-channel transistor 135 is coupled via a lead 145 to the reference supply. A node 150 is coupled to drains of p-channel transistor 130 and n-channel transistor 135. Node 150 is coupled to a circuit (not shown) via a lead 155.

For input buffer 100 in a 0.5 μm process technology, assume that threshold voltage for p-channel transistor 130 is about −0.9V and the voltage supply provides 3.3V. By using n-channel transistor 110, the voltage at node 125 will have a maximum voltage swing that ranges from 0V to about 2.8V as the input pad voltage transitions from 0V to 5V. The voltage at node 125 reaches 2.8V due to the body effect of n-channel transistor 110. P-channel transistor 130 is prevented from conducting since its gate voltage is greater than its source voltage minus its threshold voltage (2.8>3.3−0.9). Thus, static power is not dissipated through the stack consisting of p-channel transistor 130 and n-channel transistor 135.

The body effect causes the threshold voltage of a transistor to increase as the source to substrate voltage increases for an n-channel transistor and decrease for a p-channel device. Body effect is roughly constant over different processing technologies.

For input buffer 100 in a 0.35 μm process technology, assume that threshold voltage for p-channel transistor 130 is about −0.6V. The voltage at node 125 will have a maximum voltage swing that ranges from 0V to about 2.7V as the input pad voltage transitions from 0V to 5V. The voltage at node 125 reaches 2.7V due to the body effect of n-channel transistor 110. Unlike the 0.5μm technology example, p-channel transistor 130 conducts since its gate voltage is about the same as the source voltage minus its threshold voltage (2.7~3.3−0.6). Thus, static power is dissipated through the stack consisting of p-channel transistor 130 and n-channel transistor 135. Furthermore, since buffer 100 typically has large device sizes, the static current dissipated through the stacked transistors can be substantial.

Other devices compensate for this dissipated static current. However, these devices unfortunately cause contention with the input voltage so that a high impedance input is not achieved. Such a high impedance is a requirement for CMOS input buffers.

There exists, then, a need for an input buffer that can receive a high voltage input and yet dissipate low power. This buffer will also provide a high impedance input. The present invention meets this need.

SUMMARY OF THE INVENTION

The present invention is directed to a low-power input buffer comprising an inverter coupled to receive a first safe voltage range at a first node and coupled to provide an output signal, and a low-power circuit coupled to receive a second safe voltage range and coupled to control a voltage at the first node in response to the output signal and the second safe voltage range.

The first and second safe voltage ranges preferably are equivalent. The low-power circuit includes series transistors coupled to the first node and responsive to the voltage at the output node. The low-power circuit further includes a transistor coupled between the first and second nodes and responsive to an input voltage.

The present invention also includes a method of operating an input buffer comprising the steps of pulling up a voltage of a first node in response to voltages of a second node and an output node, and pulling down the voltage at the first node and the second node in response to an input voltage to provide low power consumption and a high impedance input.

The present invention preferably utilizes transistors and their body effects to prevent a voltage drop greater than the maximum rating for the transistor between the gate to source, gate to drain and gate to substrate or bulk. As a result, a high voltage supply can be input and tolerated.

The input buffer of the present invention is particularly suited to provide a level shifted output voltage in response to a high voltage input signal. As such, the output voltage can be provided in a voltage range between the minimum of the voltage high voltage input signal and the maximum of the voltage supply. In its preferred embodiment, the present invention is a low voltage CMOS device that compensates for a high voltage input in order to deliver an output that ranges between a predetermined low voltage and the voltage of the voltage supply. This range is consistent with the allowed voltage drop of the process.

Additional objects and features of the present invention will be more readily apparent from the following detailed description of the preferred embodiment and appended claims when taken in conjunction with the drawings provided herein.

DETAILED DESCRIPTION OF THE DRAWING

DETAILED DESCRIPTION OF THE EMBODIMENTS

Figure 1:
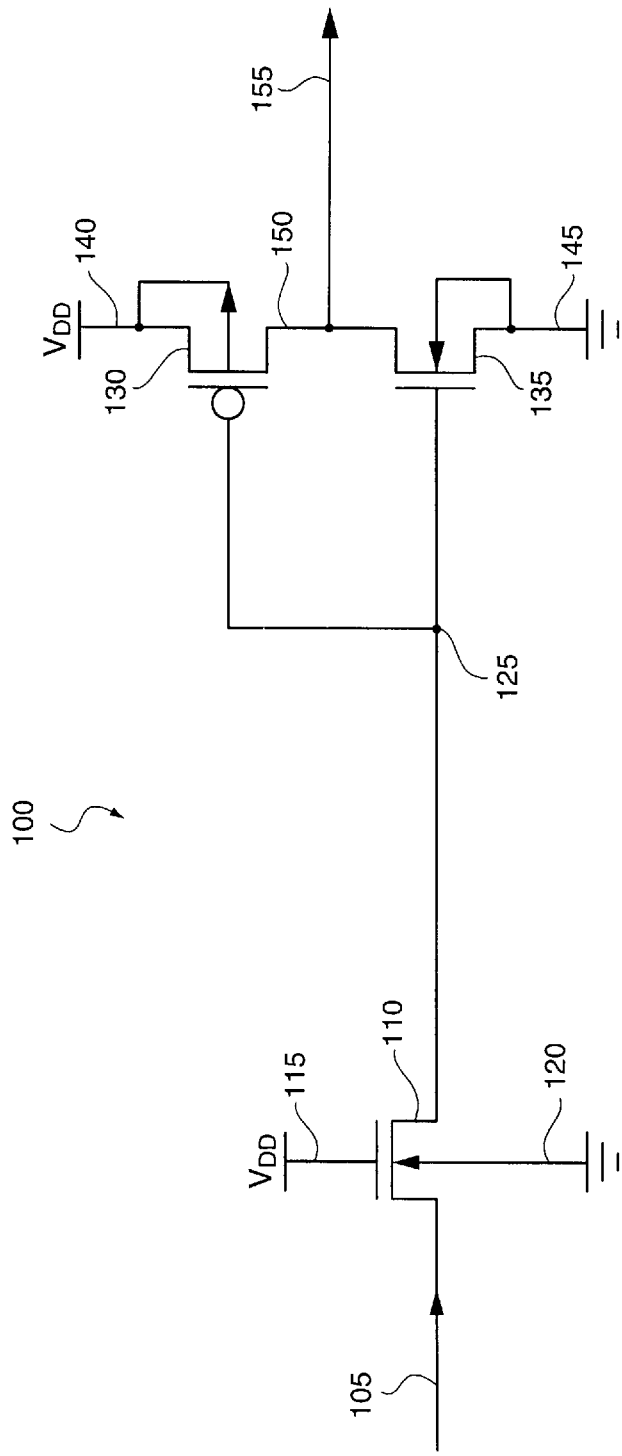
FIG. 1 is a circuit of a 5V tolerant input buffer.
Figure 2:
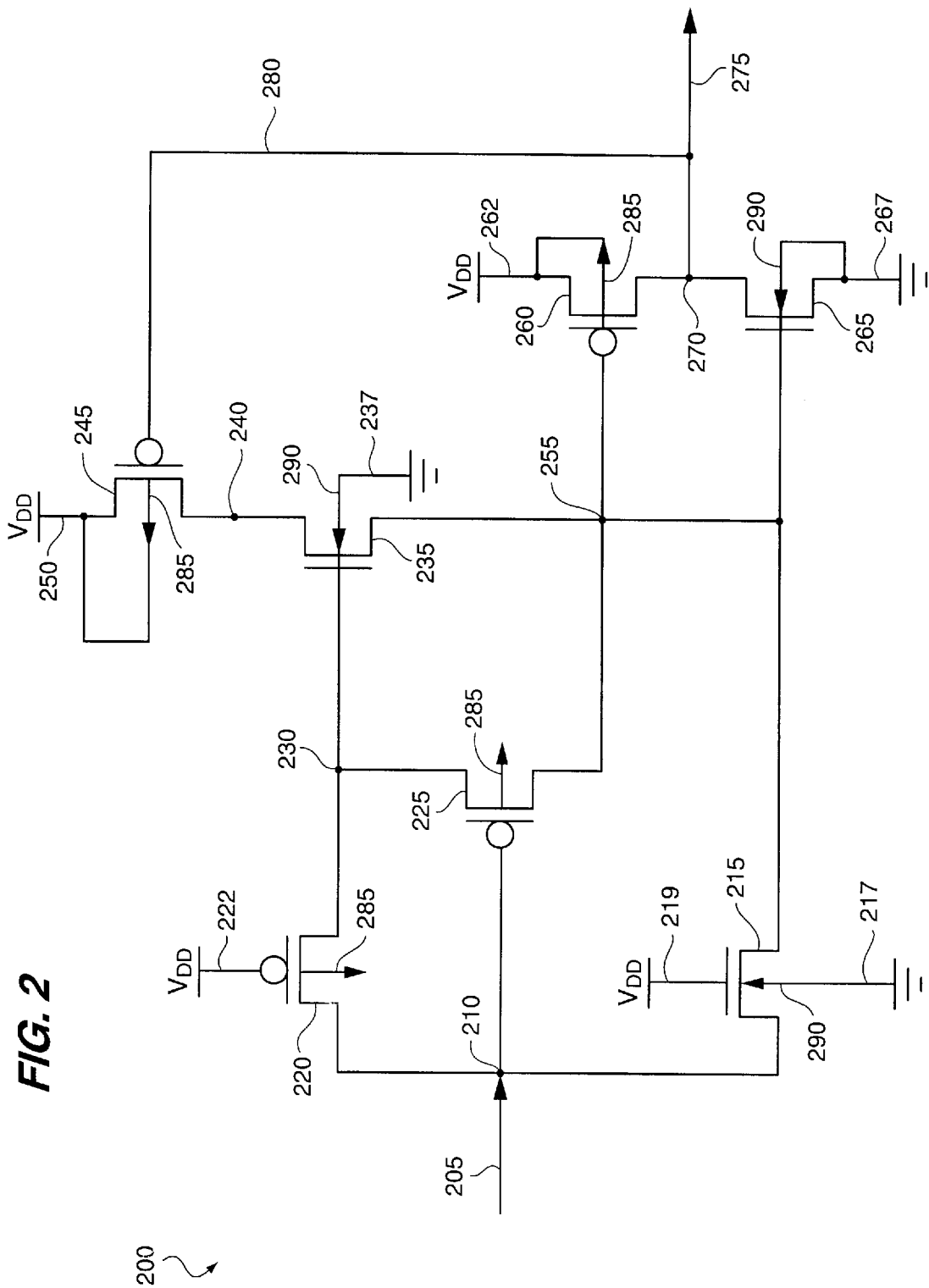
FIG. 2 is a circuit of a low-power 5V tolerant input buffer according to the present invention.

FIG. 2 illustrates a low-power high voltage tolerant input buffer 200 according to the present invention. The high voltage input to low-power buffer 200 is expected to be greater than the supply voltage for low-power input buffer 200. The high voltage is typically 5V and the supply voltage is typically 3.3V. Low-power input buffer 200 is particularly suitable for providing an input signal to a CMOS integrated circuit from a pad.

A lead 205 couples a signal from an input pad (not shown) of an integrated circuit to an input node 210. Node 210 is coupled to a source of an n-channel transistor 215, a drain of a p-channel transistor 220 and a gate of a p-channel transistor 225. A gate of p-channel transistor 220 is coupled, via a lead 222, to a voltage supply (not shown) that preferably provides approximately 3.3V. A node 230 is coupled to sources of p-channel transistors 220, 225 and to a gate of an n-channel transistor 235.

A node 240 is coupled between drains of n-channel transistor 235 and a p-channel transistor 245. A source of p-channel transistor 245 is coupled to the voltage supply via lead 250. A node 255 is coupled to a drain of p-channel transistor 225, a source of n-channel 235, a drain of n-channel transistor 215 and respective gates of a p-channel transistor 260 and an n-channel transistor 265.

An output node 270 is coupled between drains of p-channel transistor 260 and n-channel 265. A source of p-channel transistor 260 is coupled to the voltage supply via a lead 262. A source of n-channel transistor 265 is coupled to a reference voltage supply (not shown) via a lead 267. A lead 275 couples node 270 to, preferably, circuits contained in an integrated circuit (not shown). A lead 280 couples lead 275 to a gate of p-channel transistor 245.

As illustrated, substrates 285 of p-channel transistors 245 and 260 are coupled to the voltage supply. Substrates 285 of p-channel transistors 220 and 225 are coupled to a voltage supply that provides a voltage equivalent to the maximum voltage of the input signal on lead 205. Substrates 290 of n-channel transistors 215, 235 and 265 are coupled to the reference voltage supply via respective leads 217, 237 and 267. A gate of n-channel transistor 215 is coupled to the voltage supply via a lead 219.

As shown in FIG. 2, input buffer 200 uses n-channel transistor 215 to limit a voltage swing on node 255 to between a reference voltage and a voltage at the gate of n-channel 215 minus a threshold voltage of n-channel transistor 215. For example, the reference voltage can be 0V, the gate voltage can be 3.3V and the threshold voltage can be 0.6V so that the voltage at node 255 is 2.7V.

A feedback path is provided by lead 280 from lead 275 to the gate of p-channel transistor 245. P-channel transistor 245 preferably is a "weak" pull-up device. To turn n-channel 235 on enough to pull node 255 to 3.3V, node 230 preferably is pulled up to at least 3.3V plus the threshold voltage of n-channel transistor 235. Node 230 is pulled up to this voltage by connecting it to node 210 through p-channel transistor 220.

Since the gate of p-channel transistor 220 is tied to 3.3V (the exemplary supply voltage), a voltage at node 210 is supplied to node 230 when that voltage is 3.3V plus the threshold voltage of p-channel transistor 220. When this occurs, the voltage at node 230 transitions above 3.3V plus the threshold voltage of n-channel transistor 235. N-channel transistor 235 is turned on "strongly" by the voltage at node 230. Assuming that the feedback voltage from lead 275 is 0V (the input voltage is 5V), series p-channel transistor 245 and n-channel transistor 235 pull up the voltage at node 255 to 3.3V. N-channel transistor 235 will conduct 3.3V since it is "strongly" turned on.

Meanwhile, p-channel transistor 225 is off since the voltage at its gate (from node 205) is 5V, its source voltage (from node 230) is 3.3V plus the threshold voltage of p-channel transistor 220 and its drain voltage (from node 255) is 3.3V. As the voltage at node 205 transitions below 3.3V, p-channel transistor 220 starts to turn off and node 230 is not driven. As node 205 transitions to about 2.0V, n-channel transistor 215 is turned on to drive node 255 to about 2.0V.

In this state the gate and drain of p-channel transistor 225 are at about 2V, and the source still at about 4V. As a result, p-channel transistor 225 is turned on to pull node 230 to within a threshold voltage (of p-channel transistor 225) to the voltage of node 255 (about 2V). As the voltage at node 230 is pulled low, n-channel transistor 235 starts to turn off. This prevents n-channel transistor 235 and p-channel transistor 245 from "strongly" conducting. Thus, node 255 is not pulled up quite as "strongly."

While the above is occurring, the 2V at node 255 starts turning on p-channel transistor 260 and turning off n-channel transistor 265. This starts to pull the voltage at node 270 to 3.3V. The voltage at node 270 then starts to turn off p-channel transistor 245. Since p-channel transistor 245 and n-channel transistor 235 are not "strongly" conducting, the decreasing voltage at node 205 can pull down the voltage at node 255 with no contention. Node 255 can be pulled to 0V with a very small current (~nA range) since there is no contention. In addition, the elimination of contention provides for a true high impedance input for low-power input buffer 200.

The present invention is particularly suited for us in 3.3V optimized processes where the shrinking geometries cause decreasing threshold voltages. The decreasing threshold voltages can, in turn, cause power dissipation. Use of the present invention will eliminate that power dissipation.

The transistors of the present invention are preferably enhancement-type MOSFETs. As described, the present invention can function as a voltage level shifter. A low power circuit includes transistors 225, 235 and 245. The low power circuit includes an internal node 230. This low power circuit provides for the low power dissipation of the present invention while maintaining a high impedance input as required for a CMOS input buffer.

Transistors 215 and 220 provide a converted high voltage input to nodes 230, 255 as a safe voltage range for low power input buffer 200 to operate. Transistors 260 and 265 are configured as an inverter that receive the safe voltage range.

Moreover, the low power circuit can be considered coupled in parallel with transistors 215, 260 and 265 between nodes 210 and 270. As shown, the low power circuit is connected to node 255 that is internal to transistors 215, 260 and 265. As discussed above, the low power circuit controls the voltage at node 255 to provide low power dissipation while maintaining a high impedance input.

Although the present invention was described by reference to the embodiment shown in the figure, this embodiment should not be construed to limit the invention. One skilled in the art can appreciate that modifications or alterations, such as to the various voltages, are within the scope of the present invention as defined by the appended claims.

I claim:

1. A low-power buffer comprising:
   an input buffer coupled to an input node and including an internal buffer node and an output node; and
   a circuit coupled to the input node and the output node, the circuit being operable to control an internal node of the input buffer, wherein the circuit further includes an internal circuit node and a transistor that couples the internal nodes together in response to a voltage of the input node.

2. The low-power buffer of claim 1 wherein the circuit includes series transistors coupled to the internal buffer node to control the internal buffer node in response to voltages of the input and output nodes.

3. The buffer of claim 1 wherein at least one of the substrates of the input buffer and the low-power circuit is connected to a voltage supply that provides a voltage equivalent to a maximum voltage of the input node.

4. The buffer of claim 1 wherein the input buffer limits a voltage swing of the internal node.

5. The buffer of claim 1 wherein the circuit includes a device coupled to a feedback path from the output node, the device being a weak pull-up device.

6. A low-power input buffer comprising:
   an inverter coupled to a first node to receive a first safe voltage range and coupled to an output node to provide an output signal; and
   a circuit coupled to a second node to receive a second safe voltage range, and coupled to the output node and the first node to control a voltage at the first node in response to the output signal and the second safe voltage range, wherein the circuit includes a switch that couples to first and second nodes together responsive to an input signal.

7. The low-power input buffer of claim 6 wherein the first and second safe voltage ranges are equivalent.

8. The low-power input buffer of claim 6 wherein the circuit includes series transistors coupled to the first node and responsive to voltages at the second and output nodes.

9. The low-power input buffer of claim 8 wherein the low-power circuit further includes a transistor coupled between the first and second nodes and responsive to an input voltage.

10. A low-power input device comprising:
    a first transistor coupled to an input node and a first node;
    an inverter providing an output voltage on an output node in response to a voltage on the first node;
    a second transistor coupled to the input node and a second node;
    a third transistor coupled to the first node, the second node and the input node; and
    series transistors coupled to the first node, the second node and the output node.

11. A method of operating an input buffer comprising the steps of:
    pulling up a voltage of a first node in response to voltages of a second node and an output node; and
    pulling down the voltage at the first node and the second node in response to an input voltage to provide low power consumption and a high impedance input.

12. The method of claim 11 further comprising the step of limiting a voltage swing of the first node.

* * * * *